(12) United States Patent
Kieft et al.

(10) Patent No.: US 9,048,060 B2
(45) Date of Patent: Jun. 2, 2015

(54) BEAM PULSING DEVICE FOR USE IN CHARGED-PARTICLE MICROSCOPY

(71) Applicant: FEI Company, Hillsboro, OR (US)

(72) Inventors: Erik René Kieft, Eindhoven (NL); Fredericus Bernardus Kiewiet, Eindhoven (NL); Adam Christopher Lassise, Utrecht (NL); Otger Jan Luiten, Eindhoven (NL); Petrus Henricus Antonius Mutsaers, Geldrop (NL); Edgar Jan Dirk Vredenbregt, Eindhoven (NL); Alexander Henstra, Utrecht (NL)

(73) Assignee: FEI COMPANY, Hillsboro, OR (US)

( * ) Notice: Subject to any disclaimer, the term of this patent is extended or adjusted under 35 U.S.C. 154(b) by 0 days.

(21) Appl. No.: 14/056,710

(22) Filed: Oct. 17, 2013

(65) Prior Publication Data

US 2014/0103225 A1      Apr. 17, 2014

Related U.S. Application Data

(60) Provisional application No. 61/714,822, filed on Oct. 17, 2012.

(30) Foreign Application Priority Data

Oct. 22, 2012   (EP) ..................................... 12189369

(51) Int. Cl.
  *H01J 37/26*      (2006.01)
  *H01J 37/04*      (2006.01)
  *H01J 37/28*      (2006.01)

(52) U.S. Cl.
  CPC .............. *H01J 37/045* (2013.01); *H01J 37/28* (2013.01); *H01J 2237/0432* (2013.01)

(58) Field of Classification Search
  USPC ................. 250/305, 306, 307, 309, 310, 311, 250/492.1, 492.3, 396 R, 397
  See application file for complete search history.

(56) References Cited

U.S. PATENT DOCUMENTS

| 5,345,080 A | 9/1994 | Yajima et al. |
| 6,218,664 B1 | 4/2001 | Krans et al. |

(Continued)

OTHER PUBLICATIONS

Fehr, J., et al., "A 100-Femtosecond Electron Beam Blanking System," Microelectonic Engineering, 1990, pp. 221-226, vol. 12.

(Continued)

*Primary Examiner* — Nicole Ippolito
(74) *Attorney, Agent, or Firm* — Scheinberg & Associates, PC; Michael O. Scheinberg; John E. Hillert

(57) ABSTRACT

The invention relates to a charged-particle microscope comprising
  a charged-particle source;
  a sample holder;
  a charged-particle lens system;
  a detector; and
  a beam pulsing device, for causing the beam to repeatedly switch on and off so as to produce a pulsed beam.

The beam pulsing device comprises a unitary resonant cavity disposed about a particle-optical axis and has an entrance aperture and an exit aperture for the beam. The resonant cavity is configured to simultaneously produce a first oscillatory deflection of the beam at a first frequency in a first direction and a second oscillatory deflection of the beam at a second, different frequency in a second, different direction. The resonant cavity may have an elongated (e.g. rectangular or elliptical) cross-section, with a long axis parallel to said first direction and a short axis parallel to said second direction.

20 Claims, 6 Drawing Sheets

(56) References Cited

U.S. PATENT DOCUMENTS

| | | |
|---|---|---|
| 7,569,841 B2 | 8/2009 | Hill et al. |
| 8,101,928 B2 | 1/2012 | Hill et al. |
| 8,314,409 B2 | 11/2012 | Miller et al. |
| 2005/0006582 A1* | 1/2005 | Steigerwald et al. ......... 250/311 |
| 2005/0253069 A1 | 11/2005 | Zewail et al. |
| 2012/0261586 A1 | 10/2012 | Knippels et al. |

OTHER PUBLICATIONS

Lassise, A., et al., "Compact, low power radio frequency cavity for femtosecond electron microscopy," Review of Scientific Instruments, 2012, 10 pages, vol. 83.

* cited by examiner

BEAM PULSING DEVICE FOR USE IN CHARGED-PARTICLE MICROSCOPY

This application claims priority from U.S. Provisional Application 61/714,822, filed Oct. 17, 2012, which is hereby incorporated by reference.

The invention relates to a charged-particle microscope comprising:

- A charged-particle source, for producing a beam of charged particles that propagates along a particle-optical axis;
- A sample holder, for holding and positioning a sample;
- A charged-particle lens system, for directing said beam onto a sample held on the sample holder;
- A detector, for detecting radiation emanating from the sample as a result of its interaction with the beam;
- A beam pulsing device, for causing the beam to repeatedly switch on and off so as to produce a pulsed beam.

The invention also relates to a method of using such a charged-particle microscope.

As used throughout this text, the ensuing terms should be interpreted as follows:

The term "charged particle" encompasses an electron or ion (generally a positive ion, such as a Gallium ion or Helium ion, for example, though a negative ion is also possible). It may also be a proton, for example.

The term "charged-particle microscope" (CPM) refers to an apparatus that uses a charged-particle beam to create a magnified image of an object, feature or component that is generally too small to be seen in satisfactory detail with the naked human eye. In addition to having an imaging functionality, such an apparatus may also have a machining functionality; for example, it may be used to locally modify a sample by removing material therefrom ("milling" or "ablation") or adding material thereto ("deposition"). Said imaging functionality and machining functionality may be provided by the same type of charged particle, or may be provided by different types of charged particle; for example, a Focused Ion Beam (FIB) microscope may employ a (focused) ion beam for machining purposes and an electron beam for imaging purposes (a so-called "dual beam" microscope), or it may perform machining with a relatively high-energy ion beam and perform imaging with a relatively low-energy ion beam.

The term "sample holder" refers to any type of table, platform, arm, etc., upon which a sample can be mounted and held in place. Generally, such a sample holder will be comprised in a stage assembly, with which it can be accurately positioned in several degrees of freedom, e.g. with the aid of electrical actuators.

The term "charged-particle lens system" refers to a system of one or more electrostatic and/or magnetic lenses that can be used to manipulate a charged-particle beam, serving to provide it with a certain focus or deflection, for example, and/or to mitigate one or more aberrations therein. In addition to (various types of) conventional lens elements, the charged-particle lens system (particle-optical column) may also comprise elements such as deflectors, stigmators, multipoles, aperture (pupil) plates, etc.

The phrase "radiation emanating from the sample" is intended to encompass any radiation that emanates from the sample as a result of its irradiation by the charged-particle beam. Such radiation may be particulate and/or photonic in nature. Examples include secondary electrons, backscattered electrons, X-rays, visible fluorescence light, and combinations of these. Said radiation may also simply be a portion of the incoming beam that is transmitted through or reflected from the sample, or it may be produced by effects such as scattering or ionization, for example.

The term "detector" should be broadly interpreted as encompassing any detection set-up used to register (one or more types of) radiation emanating from the sample. Such a detector may be unitary, or it may be compound in nature and comprise a plurality of sub-detectors, e.g. as in the case of a spatial distribution of detector units about a sample holder, or a pixelated detector. The detector may be used in image formation and/or for spectroscopic investigation (e.g. as in the case of techniques such as EDX or WDX (Energy- or Wavelength-Dispersive X-ray Spectroscopy), EELS (Electron Energy-Loss Spectroscopy) and EFTEM (Energy-Filtered Transmission Electron Microscopy)).

In what follows, the invention will—by way of example—often be set forth in the specific context of electron microscopes. However, such simplification is intended solely for clarity/illustrative purposes, and should not be interpreted as limiting.

Electron microscopy is a well-known technique for imaging microscopic objects. The basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" beam of ions, allowing supportive activities such as ion-beam milling or ion-beam-induced deposition, for example.

In traditional electron microscopes, the imaging beam is continuously "on" during a given imaging session. However, in recent years, the possibility of being able to perform "time-resolved" microscopy using a pulsed electron beam has attracted interest. In such microscopy, the use of a pulsed input beam allows output from the employed detector to be discretized into a temporal train of timestamped components (e.g. images or spectra). The principle behind such microscopy can be compared to the principle underlying stroboscopic photography, where the use of a high-speed flash allows continuous motion of a photographed object to be captured as a temporal train of freeze-frame exposures—facilitating accurate analysis of subtle differences between the captured frames. By using a pulsed (or "flashed") charged-particle beam in a CPM, it becomes possible to accurately investigate dynamic processes in a sample, such as phase transitions, mechanical vibrations, heat dissipation, chemical reactions, biological cell division, fluid flow, electrical response, radioactive decay processes, etc.

Of particular interest as regards the technique elucidated in the previous paragraph is the ability to produce ultra-short-duration charged-particle pulses, since these can in turn be used to investigate ultra-fast dynamic processes. One known way of producing such pulses is to embody the charged-particle source to comprise a photo-electric emitter (e.g. a heated $LaB_6$ crystal), and embody the beam pulsing device as a pulsed laser beam that irradiates said emitter with ultra-short bursts of light (e.g. with a duration of the order of picoseconds (ps) or femtoseconds (fs)); such a technique is set forth, for example, in US 2005/0253069 A1. Since it is relatively easy to acquire and use lasers that are capable of producing extremely short light pulses, this particular method would appear to lend itself to ultra-fast time-resolved analysis of samples. However, a significant drawback of this known technique is that the employed photo-electric emitter produces a much lower electron brightness than is typically available from a conventional (e.g. Schottky) source in an electron microscope, which severely limits the practical usefulness of this approach.

In an alternative solution, one could elect to use a conventional electron source (such as the aforementioned Schottky source), and embody the beam pulsing device as a beam "chopper" or "blanker" that interrupts/passes the electron beam in an oscillatory manner. For example, the beam pulsing device might employ a beam deflector in which electrodes generate an oscillatory electric field that periodically laterally deflects the electron beam away from a nominal particle-optical axis, thus effectively creating a pulsed beam further downstream. In a more sophisticated variant, one could use a resonant cavity to produce said beam deflection. Although this method has the advantage of using a high-brightness electron source, it is generally of limited flexibility as regards its application to practical beam chopping. In particular, this method does not lend itself to the production of short pulses (e.g. with a pulse lengths in the fs-ps range) at relatively low frequencies (e.g. of the order of 100 MHz), since the former aspect (short pulses) requires a relatively high deflection frequency whereas the latter aspect (relatively long period between pulses) requires a relatively low deflection frequency, and these two different demands are difficult to mutually reconcile. For an example of this approach, reference is made to the article by K. Ura et al., "*Picosecond Pulse Stroboscopic Scanning Electron Microscope*", J. Electron Microsc., Vol. 27, No. 4 (1978), pp. 247-252.

In a variant of the approach set forth in the previous paragraph, one could attempt to embody the beam pulsing device as a series configuration of two "crossed" deflectors with intermediate drift space; here, the term "crossed" is used to indicate that the deflection direction (e.g. along an x-axis) of one deflector is perpendicular to the deflection direction (e.g. along a y-axis) of the other deflector. The idea here is that the input to the second deflector is pulsed by the first deflector, so that the second deflector produces "a pulse of a pulse" or, in effect, a beat. Such a configuration would allow more flexibility, in that there are now different frequencies that can be adjusted (deflection frequencies of first and second deflections, and beat frequency of the superimposed deflections) so as to allow more independent variation of the pulse length and pulse frequency of the output (resultant) pulse. However, it should be noted that use of such a set-up in a CPM beam pulsing device would tend to significantly complicate the employed particle-optical column between source and sample. This is because, in order to work satisfactorily, each deflector is ideally situated at the focal point of a lens (located upstream in the particle-optical column), e.g. a condenser/objective lens. If one employs an x-deflector at position $z_1$ along the particle-optical axis and a y-deflector at position $z_2$ along the same axis, then a first stigmator will have to be used upstream of the deflectors so as to deliberately introduce enough astigmatism to give each deflector its respective focus, and a second stigmator will have to be used downstream of the deflectors in order to subsequently mitigate this deliberately introduced astigmatism. Because the two deflectors are in series arrangement and have an intermediate drift space, the distance $\Delta z=|z_2-z_1|$ will be relatively large (e.g. of the order of a few cm), thus requiring relatively large and powerful stigmators—which tends to be a significant disadvantage in a (typically) cramped particle-optical column.

It is an object of the invention to address these issues. More specifically, it is an object of the invention to provide a CPM in which ultra-fast time-resolved microscopy can be satisfactorily performed. In particular, it is an object of the invention that such a CPM should employ a charged-particle beam pulsing device with which it relatively easy to (independently) adjust the obtained pulse length and pulse frequency, without introducing excessive astigmatism. More specifically, it is an object of the invention that such a beam pulsing device be capable of producing ultra-short beam pulses (e.g. with ps or fs pulse lengths) at relatively low frequencies (e.g. of the order of 100 MHz). Moreover, it is an object of the invention that the charged particle beam in such a CPM should have satisfactory brightness.

These and other objects are achieved in a charged-particle microscope as set forth in the opening paragraph, characterized in that the beam pulsing device comprises a unitary resonant cavity disposed about said particle-optical axis and having an entrance aperture and an exit aperture for the beam, which resonant cavity is embodied to simultaneously produce a first oscillatory deflection of the beam at a first frequency in a first direction and a second oscillatory deflection of the beam at a second, different frequency in a second, different direction.

The beam pulsing device in the CPM according to the present invention simultaneously produces two different deflections in a single (unitary) resonant cavity; consequently, there is no longer a need to use the powerful stigmators referred to above, because the abovementioned substantial focus separation $\Delta z$ is no longer present. The absence of such large stigmators, coupled with the much more compact size of the inventive beam pulsing device parallel to the particle-optical axis direction (single cavity rather than dual cavities with intermediate drift space), results in very significantly reduced demands on available space in the particle-optical column of the CPM. The beam pulsing device according to the present invention is thus more space-saving and produces fewer aberration issues.

In a particular embodiment of the invention, said unitary resonant cavity is:
  Substantially cylindrical in form, with a cylindrical axis that is substantially collinear with said particle-optical axis (z-axis);
  Embodied to be excited in $TM_{110}$ resonant mode.

It should be noted that the term "cylindrical" is used here in a strict mathematical sense, and thus encompasses cylinders that do not have a circular cross-section. According to standard usage in the field of electromagnetism, the symbol "TM" indicates a Transverse Magnetic field, i.e. an electromagnetic field that has no longitudinal magnetic component (so that B=0 along the z-axis). The triplet of subscripts "110" denotes integer eigenvalues of a wave vector k needed to satisfy boundary conditions pertaining to Maxwell's equations in the cavity. Without going into further mathematical detail, a $TM_{110}$ mode is a dipole mode with a strong lateral magnetic field at radius r=0 (measured outward from the z-axis) and zero electric field at r=0. Such a mode can, for example, be excited in the cavity with the aid of a Hertzian dipole loop antenna placed close to the wall of the cavity (distal from the z-axis). An antenna of this type can, for example, be achieved by:
  Creating a small bore in a wall of the cavity;
  Feeding the inner conductor of a coaxial cable through this bore to the interior of the cavity, in such a way that said inner conductor does not touch said (conducting) wall;
  Creating a loop in said inner conductor proximal to said wall;

Orienting the loop appropriately (e.g. so that its plane is normal to the y-axis, to excite a magnetic field parallel to y);

Connecting said coaxial cable to an oscillating Radio Frequency (RF) power supply.

The vibrational behavior of the cavity can be adjusted in various ways. For example, the frequency of said oscillating power supply can be altered. Alternatively, a small conducting (e.g. metallic) or dielectric "plunger" (tuning element) can be partially inserted into the cavity, e.g. through a small bore opposite the above-mentioned antenna; the extent of insertion of such a plunger will then influence the resonant frequency of the cavity, because:

Insertion of a conducting plunger will locally decrease the effective radius of the cavity, with an attendant increase in resonant frequency;

Insertion of a dielectric plunger will increase the effective dielectric constant of the cavity, with an attendant decrease in resonant frequency.

Needless to say, when the cavity is excited on-resonance (i.e. the frequency of the oscillating power supply is matched to the resonant frequency of the cavity), the resulting electromagnetic fields in the cavity will be at their largest. The skilled artisan in the field of electromagnetism will be familiar with such concepts, and will be able to implement and optimize them according to the details/requirements of a particular configuration. In particular, he will realize that other types and/or locations of antenna (or other means of excitation) can be employed, as well as other types and/or locations of tuning element/plunger. He will also understand that he is not limited per se to a $TM_{110}$ resonance mode, and that, in principle, other types of TM, TE (Transverse Electric) and/or Transverse Electro-Magnetic modes may be equally or better suited to a given set-up.

In order to simultaneously excite two different resonances of mutually different frequency in the same cavity, one can, for example, concurrently use two different excitement antennae (of a type as described above, or similar), each antenna working in unison with its own plunger/tuning element (again of a type as described above, or similar). In such a set-up, one antenna/plunger pair can be aligned so as to produce an oscillatory deflection along said first direction, and the other plunger/antenna pair can be aligned so as to produce an oscillatory deflection along said second direction. The positions of the plungers and/or the driving frequency of the antennae can then be adjusted to as to give said oscillatory deflections the desired frequencies. However, there are alternatives to such a set-up. For example, one could attempt to use a single excitement antenna in conjunction with two different plungers—though such an arrangement will generally be less flexible than a two-antenna approach. Yet another alternative is set forth in the next paragraph.

In a noteworthy embodiment of a CPM according to the current invention, the resonant cavity—when viewed in a direction normal to said particle-optical axis (z axis)—has an elongated cross-section, with a long axis parallel to said first direction and a short axis parallel to said second direction. In a particular such embodiment, said long and short axes are substantially perpendicular (though this is not strictly necessary). Because its cross-section has two different characteristic dimensions, such a resonant cavity can simultaneously support two different resonances—one along each said dimension (as explained above, resonant frequency depends inter alia on the (effective) internal dimension of the cavity). In many practical applications of the invention, only a relatively small frequency difference will be required between said two resonances, so that the difference between said two dimensions may be correspondingly small; nevertheless, the current embodiment will generally allow larger frequency differences to be achieved (if desired) than the set-up described in the previous paragraph. Examples of cross-sectional forms as alluded to here include rectangles and quasi-rectangular forms such as "racetracks" (in which the two opposing straight sides of a rectangle are replaced by curved sides).

In a particular example of an embodiment as set forth in the previous paragraph, the resonant cavity's cross-section is (substantially) an ellipse, with a major and a minor axis that correspond respectively to said first and second directions. Such a geometrical configuration is advantageous in that:

An ellipse doesn't contain any discontinuities in its form (e.g. corners, angles), thus simplifying the electromagnetic field configurations produced inside an elliptical cavity;

An ellipse is a relatively good approximation to a circular cross-section, with its various symmetry-associated benefits. This is particularly the case for an ellipse of relatively mild eccentricity;

Even relatively mild eccentricity of an ellipse provides enough scope to slightly vary the effective internal dimensioning of the cavity in a particular direction, for the purpose of resonant frequency adjustment.

In the current context, an oval or quasi-oval may be regarded as an approximation to an ellipse.

To make an embodiment as set forth in either of the preceding two paragraphs tunable, one could make use of tuning elements/plungers as set forth above. However, as an alternative/supplement to such an approach, one can also embody the resonant cavity to be mechanically deformable so as to adjust a ratio of the lengths of said long and short axes (major and minor axes). For example, one could conceive a scenario whereby the cavity walls are (at least partially) made of a pliable material (such as plastic) that is coated with a film of metal or another conducting material; such walls can then be locally nudged/squeezed/moved by appropriately placed actuators so as to change their form/dimensioning/position, thus (locally) altering the effective internal dimensions of the cavity and, accordingly, its resonant behavior.

For good order, it should be noted that, in a cylindrical cavity with a perfectly circular cross-section, and with perfectly smooth walls that are uninterrupted by bores or protrusions, excitation of a given resonance mode can, in fact, concurrently produce more than one degenerate "versions" of the same mode; for example, one could obtain two degenerate $TM_{110}$ modes—one with a magnetic field oriented along the x-axis and another with a magnetic field oriented along the y-axis. However, the moment an imperfection is introduced into such a cavity (e.g. by sliding in an antenna or plunger, or by introducing a deformation of the circular cross-section), such degeneracy is broken, and one of said "versions" will become dominant. The embodiments in the preceding paragraphs exploit this effect.

A resonant cavity as used in the current invention may, in a relatively simple embodiment, contain a vacuum through which the charged-particle beam propagates. However, in an alternative embodiment, the inventive resonant cavity comprises a dielectric material that is disposed about said particle-optical axis and that contains a substantially axially symmetric void through which the beam can pass. Use of a dielectric material in this manner allows a higher field amplitude and frequency to be achieved for the same input power, or, equivalently/alternatively, results in lower power requirements to generate the same field amplitude and frequency (as compared to a vacuum-filled cavity). Examples of candidate dielectrics in this context include materials such as $ZrTiO_4$, sapphire, fused quartz, alumina, PTFE (PolyTetraFluoroEthylene) and $ZrO_2$, for instance. Said void is preferably substantially axially symmetric with respect to the particle-optical axis—e.g. (quasi-)conical or bell-shaped, or cylindrical—so as to allow the charged-particle beam (in its various states of deflection and non-deflection) to continue to traverse the cavity without (significantly) intercepting the dielectric material.

In a refinement of an embodiment as set forth in the previous paragraph, an interface between said void and said dielectric material is at least partially coated by a film of electrically conductive material. Put another way, the inward-facing surface of the dielectric body that delimits said void is (at least partially) metallized or coated with a (thin) film of other conductive material, such as ITO (Indium Tin Oxide). In this way, the accumulation of unwanted/parasitic electric charge at the interface between the void and dielectric is advantageously mitigated—since the presence of such charge would tend to disturb the operation/deflection performance of the cavity. However, so as not to disturb the intended electromagnetic field distribution inside the cavity, the employed conductive film should be relatively thin. More specifically, in order to make the film essentially transparent to said field at the resonance frequency of the cavity, the film thickness should be substantially smaller than the so-called skin depth $\delta$ at that frequency, which is given by the expression:

$$\delta = \sqrt{\frac{2\rho}{\omega\mu}}$$

where $\rho$ and $\mu$ are, respectively, the resistivity and magnetic permeability of the film material, and $\omega=2\pi f$ is the angular frequency corresponding to a linear frequency f. As an example, for copper ($\rho=1.71\times10^{-8}$ $\Omega\cdot m$, $\mu\approx\mu_3=4\pi\times10^{-7} N\cdot A^{-2}$) at a resonance frequency of 3 GHz, $\delta=1.2\,\mu m$. For (non-magnetic) film materials with higher resistivity, the skin depth will be larger. Needless to say, if the film is relatively thin, then its DC conductance will be accordingly low; however, even a relatively poor conductor at the surface of the dielectric will be capable of preventing a gradual build-up of electric charge.

The discussion above has been largely structural in nature, but it is also possible to give a more functional description of the operation of the invention. In this respect, it should be remembered that:

When two waveforms of (slightly) different frequency are superimposed, one obtains a train of beats, and the frequency of these beats is (highly) sensitive to the frequency difference between said superimposed waveforms. Similarly, the frequency of the beam pulses observed at sample level in a CPM according to the present invention can be tuned by altering the frequency difference between the two resonances that are simultaneously produced in the unitary resonant cavity of the inventive beam pulsing device.

If the frequency of a deflection is kept constant and its amplitude is increased, then the linear speed of the deflection must also necessarily increase, and vice versa. Accordingly, if one increases the amplitude of the output of the oscillating power supply that is driving (at least one of the resonances in) the inventive resonant cavity, the speed with which the charged-particle beam is deflected back and forth will also increase; a point situated on the deflection path of the beam will thus experience a shorter pulse duration as the beam passes by. And vice versa.

By adjusting the relative phase between the two oscillatory deflections in the inventive resonant cavity, one can influence the location of a beat at a given moment in time. This effect can, if desired, be exploited to influence spatial alignment and/or synchronization aspects of the pulsed charged-particle beam, as set forth in more detail below.

In further continuance of this discussion, an aspect of the current invention is characterized in that:

In operation, said resonant cavity causes the charged-particle beam to trace out a composite geometrical figure (e.g. a so-called Lissajous figure) on a masking plane perpendicular to the particle-optical axis;

The microscope comprises a masking plate located in said masking plane and having an opening that can be positioned so as to intersect said composite geometrical figure, thus serving to admit a pulse of charged particles as the beam traces across said opening.

As set forth above, a resonant cavity as specified by the current invention is capable of simultaneously exciting two different oscillatory deflections (of a charged-particle beam) in two different lateral directions and at mutually different frequencies. The net effect/resultant of these two deflections will be to cause the beam to "dance" out a composite (and periodic) geometrical figure on a plane normal to the (nominal) particle-optical axis. More specifically, in the case of sinusoidal oscillations along the x- and y-axes (which may differ in amplitude, frequency and phase), said figure will be a Lissajous figure—which term, in fact, encompasses a whole family of figures whose shapes are sensitive to the aforementioned amplitude, frequency and phase values. If, while tracing out such a composite geometrical figure, the beam traverses an opening (e.g. relatively small hole or slit) in a front side of a masking plate, it will momentarily poke through the opening and cause a beam pulse to be observed at the back side of the plate. For a given geometrical figure, if said opening doesn't initially lie at some point along the course of the figure, it can be made to do so in various ways, e.g. by changing the position of the opening (moving the plate or certain parts thereof) and/or adjusting the aforementioned relative phase between the two oscillatory deflections.

Even if the oscillating power supply drives the inventive cavity with a non-sinusoidal waveform (such as a sawtooth or block wave), it should be remembered that such waveforms can nevertheless be decomposed into a sum of sinusoids (Fourier decomposition), whence the discussion above remains pertinent.

For the sake of clarity, it should be explicitly remembered that pulse length is not necessarily directly related to pulse frequency, and that a pulse train may comprise extremely short pulses (e.g. a few picoseconds or femtoseconds per pulse) at a relatively "low" frequency (e.g. in the Megahertz range), simply because there is a relatively long "dead time" between successive pulses. The current invention allows independent adjustment of pulse length and pulse frequency—an aspect that is inter alia of importance in the context of the next paragraph.

The dynamic processes investigated using the CPM/method of the current invention may, if desired, be deliberately precipitated/maintained/steered by applying an appropriate external stimulus (e.g. radiative, thermal, electrical, chemical, acoustic and/or mechanical) to the sample under investigation, whereby the application of such stimulus may, if desired/required, be matched to the timing/phase of the pulsing behavior of the employed charged-particle beam. For example, the sample under investigation may have some property that can be influenced by the light and/or heat that is locally delivered by a focused laser beam. The laser in such an instance will typically deliver relatively short light pulses that are separated by dead periods in which the lasing cavity "reloads", e.g. resulting in picosecond pulses at a frequency of, say, 75 MHz. It can be highly advantageous if a CPM that is used to obtain imagery and/or spectroscopic information from such a sample is capable of producing charged-particle beam pulses that are matched (in terms of duration, frequency and phase) to those of the laser. In this way, innovative analysis techniques—such as high-brightness FEELS (Femtosecond Electron Energy-Loss Spectroscopy)—can be exploited for sample analysis purposes. It should be noted that the laser-based example given here is not limiting. For example, one could apply an electrical stimulus (e.g. inductively, or using a contact probe), or a mechanical stimulus (using a vibrating membrane), etc.

The invention will now be elucidated in more detail on the basis of exemplary embodiments and the accompanying schematic drawings, in which:

FIG. 1A renders a transverse cross-section (in plan view) of a unitary resonant cavity comprised in a beam pulsing device for use in a charged particle microscope (CPM) according to the present invention.

Figure 3:
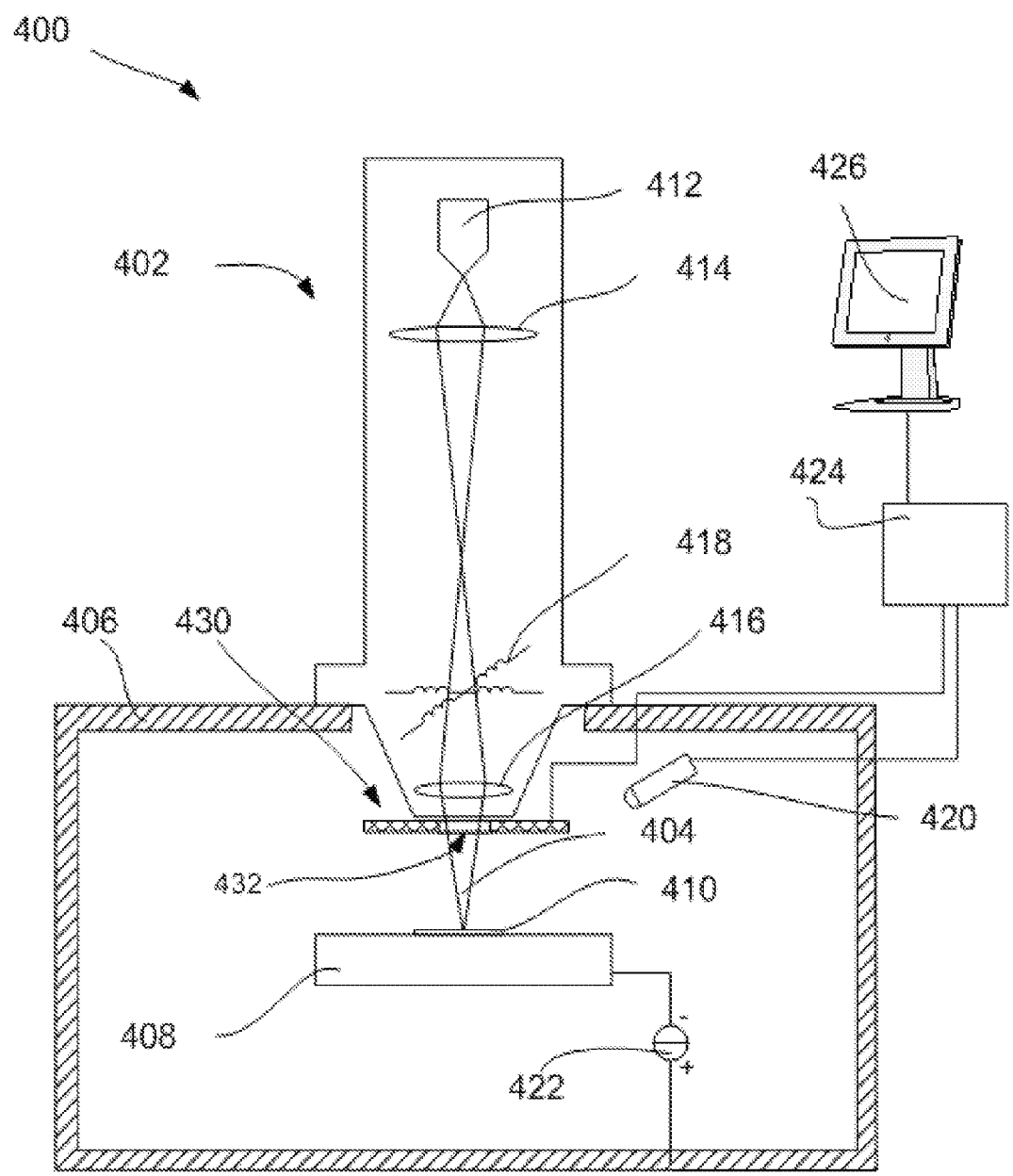

FIG. 3 renders a longitudinal cross-sectional view of another type of CPM (in this case, a SEM) in which the present invention can be employed.

Figure 4:
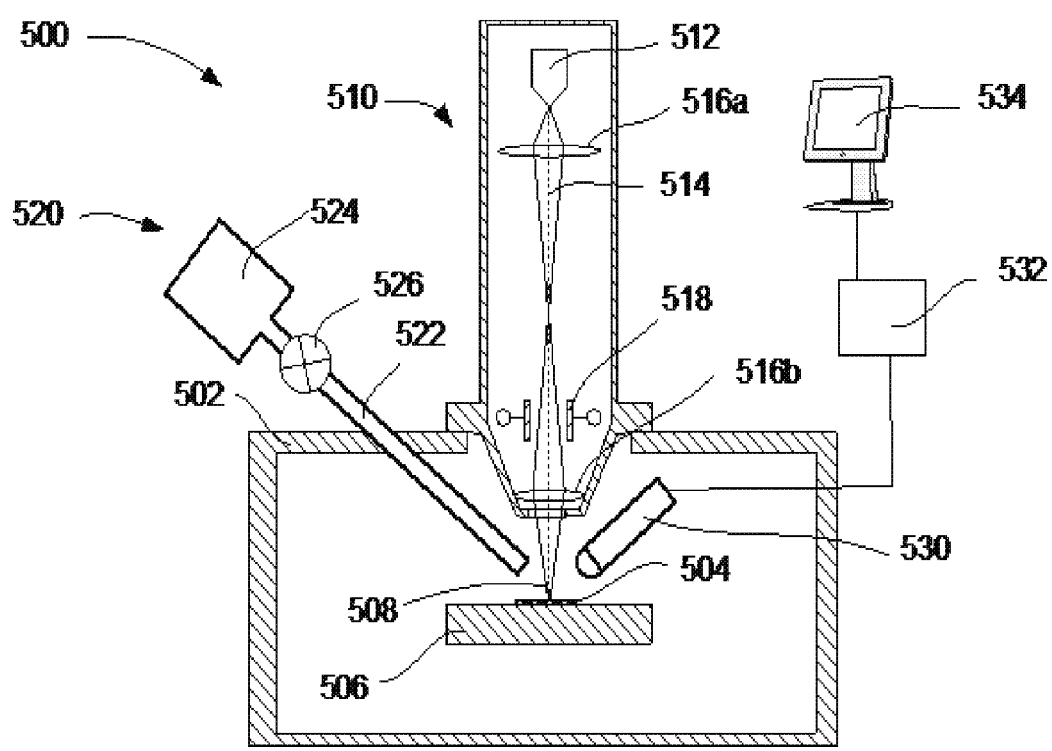

FIG. 4 depicts a longitudinal cross-sectional view of yet another type of CPM (in this case, a FIB microscope) in which the present invention can be put to use.

In the Figures, corresponding parts may be indicated using corresponding reference symbols.

Embodiment 1

Figure 1A:
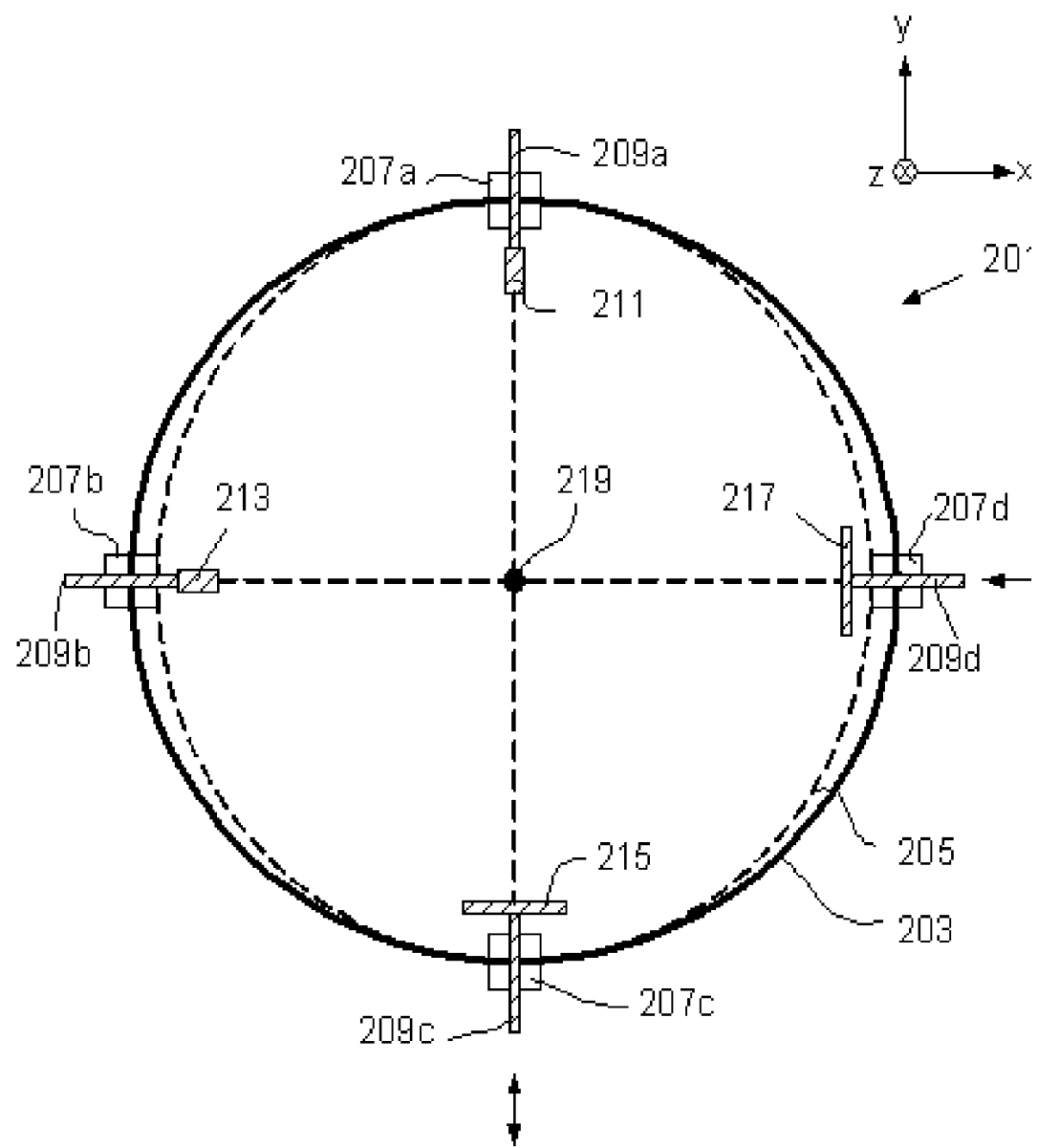
FIG. 1B shows a longitudinal cross-section (in elevation) of the subject of FIG. 1A.
FIG. 1C shows magnetic and electrical field configurations in the subject of FIGS. 1A and 1B for a $TM_{110}$ resonance mode.
FIG. 1D illustrates a Lissajous figure that can be traced out by a charged-particle beam traversing a resonant cavity as depicted in FIGS. 1A and 1B, in operation.
Figure 1B:
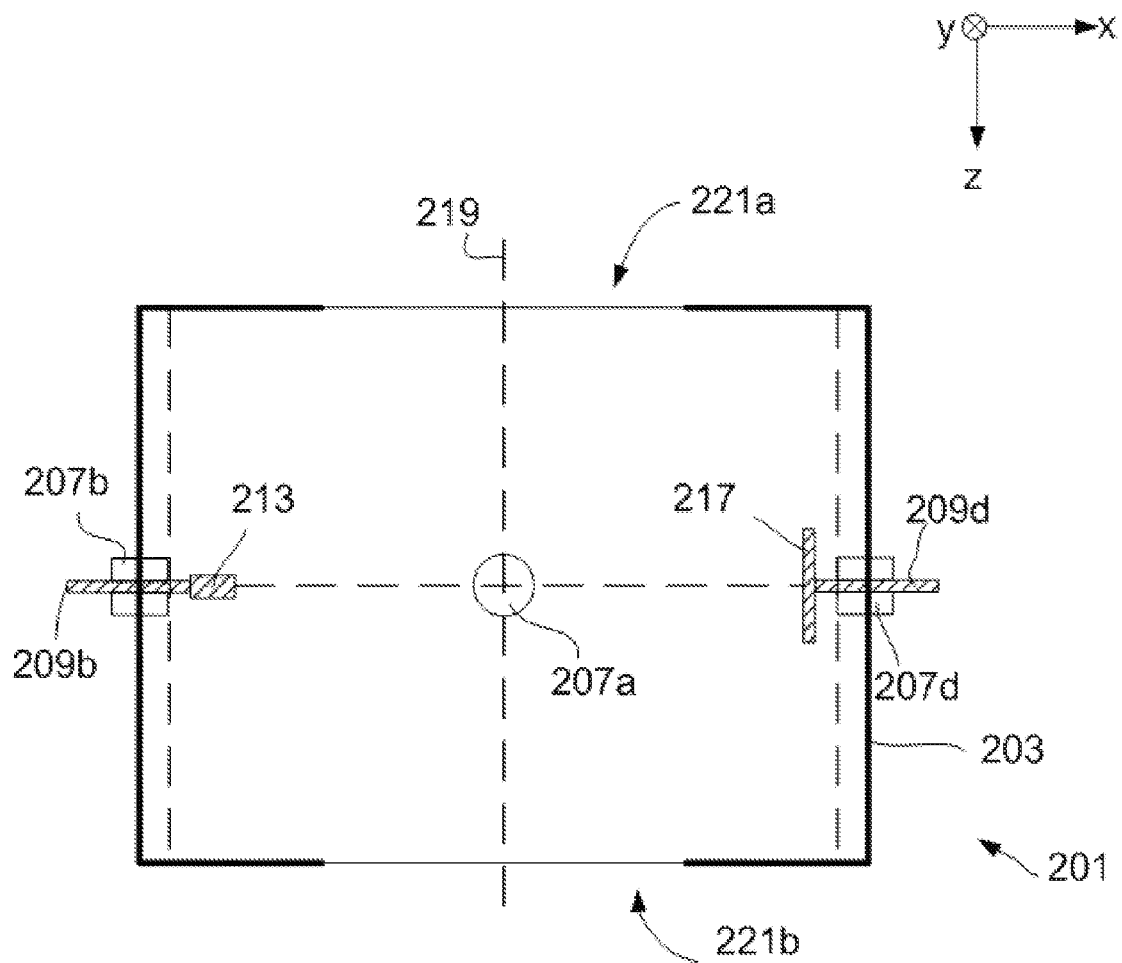

FIGS. 1A and 1B render various views of a unitary resonant cavity 201 comprised in a beam pulsing device for use in a charged particle microscope (CPM) according to the present invention. More particularly:

FIG. 1A renders a lateral cross-sectional view of the resonant cavity 201, observed along the z axis. When located in the CPM, the cavity 201 will be placed/aligned so that the CPM's particle-optical axis 219 extends along this z-axis;

FIG. 1B renders a longitudinal cross-sectional view of the same resonant cavity 201, in which the z axis is now vertical.

Also illustrated are x and y axes, which form a Cartesian coordinate system together with said z axis.

As depicted in FIG. 1A, the cavity 201 has a substantially elliptical transverse cross-section, with a major axis parallel to the x-axis (first direction) and a minor axis parallel to the y-axis (second direction). The dashed circle 205 in FIG. 1A is drawn centered on the cavity 201, to act as a reference to more clearly reveal the elliptical form of the depicted cross-section. As is evident from FIG. 1B, the cavity 201 is cylindrical in shape, and its cylindrical axis is substantially collinear with the depicted optical axis 219. Entrance aperture 221a and exit aperture 221b allow a charged-particle beam propagating along the optical axis 219 to enter and leave the interior of the cavity 201, respectively. A cavity of such form is sometimes referred to as a "pillbox cavity".

In practice, entrance aperture 221a and exit aperture 221b may be quite small, e.g. of the order of about a millimeter wide (whereby it should be noted that a typical width of the charged-particle beam will be of the order of about a few tens of microns); if desired, exit aperture 221b may be somewhat wider, to allow for greater deflection amplitudes of the charged-particle beam from the particle-optical axis 219. In this respect, it should be noted that apertures 221a and 221b are not drawn to scale.

Cavity wall 203 is made of conducting material, e.g. copper sheet with a thickness of a few mm. Provided in this wall 203 at successive angular intervals of 90° about the z-axis and in a common plane normal to the z-axis are small bores 207a, 207b, 207c, 207d, such that bores 207a, 207c oppose one another along the y-axis and bores 207b, 207d oppose one another along the x-axis. Through these bores 207a, 207b, 207c, 207d protrude respective rods 209a, 209b, 209c, 209d. Two of these rods—209a, 209b—carry respective excitement antennae 211, 213, whereas the other two rods—209c, 209d—carry respective tuning elements 215, 217. These tuning elements 215, 217 take the form of plungers (disks) that can be moved laterally into and out of the cavity 201, thus allowing adjustment of the effective internal width of the cavity 201 along the y- and x-axes, respectively (or serving to alter the net dielectric constant of the cavity interior). The excitement antennae 211, 213 are located proximal the wall 203, as far as practicable from the particle-optical axis 219.

The excitement antennae 211, 213 are connected via coaxial cables to respective (RF) Gigahertz oscillating power supplies (not shown); in fact, as set forth above, one possible embodiment of the antennae 211, 213 simply takes the form of a loop in the inner conductor (core) of each such coaxial cable. The output of said power supplies is adjusted so as to produce the desired simultaneous resonances of the cavity 201—in the current example, two $TM_{110}$ resonance modes that are mutually perpendicular. Because of the elliptical cross-section of the cavity 201, with the attendant difference in its internal width along the x- and y-axes, these two resonances will have (slightly) different resonant frequencies. The exact resonance frequency values can be tuned by (slightly) sliding either or both of the tuning elements 215, 217 into/out of the cavity 201; alternatively/supplementally, if the wall 203 is pliable, the eccentricity of the cavity 201 can be slightly altered, e.g. with the aid of (undepicted) actuators (and/or by manual adjustment).

In a specific example, it is elected to have the resonant frequencies of the cavity 201 at or close to a value of 3GHz. This is not a limiting value: it is merely conveniently achievable, and has an additional advantage of being the 40th harmonic of 75MHz. This latter frequency is the pulse frequency of many commercially available lasers, and such lasers can, if desired, be employed to apply an external stimulus to a sample during examination in a CPM (see above). It is thus relatively easy to phase-lock a 3GHz signal from an oscillating power supply and a 75MHz output from a laser. It is also relatively easy to tune the two resonant frequencies of the cavity 201 to, for example, 3 GHz along the elliptical cavity's major axis (x-axis) and 3.075GHz along its minor axis (y-axis)—leading to a frequency difference of 75MHz, and thus allowing excellent synchronization to light pulses produced with such a laser. For the frequency value(s) in question, the lateral dimensions of the cavity 201 will depend inter alia on the dielectric medium present within the wall 203. For example:

If the dielectric is vacuum, one obtains a minor-axis length ($a_y$) of ca. 122 mm and a major-axis length ($a_x$) of ca. 134 mm. The power loss (P) for such a cavity is ca. 393 W, and its so-called Quality factor (Q) has a value of ca. 11100, assuming a magnetic field value of B≈3 mT (milliTesla) in the cavity.

In an alternative case, the cavity 201 is largely filled with a ceramic dielectric comprising $ZrTiO_4$ doped with <20% SnTiO4. The employed body of dielectric is circle-cylindrical in form, fills the reference circle 205, and comprises a central 3 mm-wide shaft to allow passage of the electron beam. The above-mentioned values then become (approximately) $a_y$≈20 mm, $a_x$≈22 mm, P≈45 W and Q≈2600. The values of $a_x$ and $a_y$ scale according to $\sqrt{\in_r}$, where $\in_r$ is the relative permittivity of the employed dielectric (relative to vacuum), with $\in_r$≈37 in the current case.

The above example assumes a length of the cavity 201 (parallel to the z-axis) of ca. 17 mm (though other values are, of course, possible).

Figure 1C:
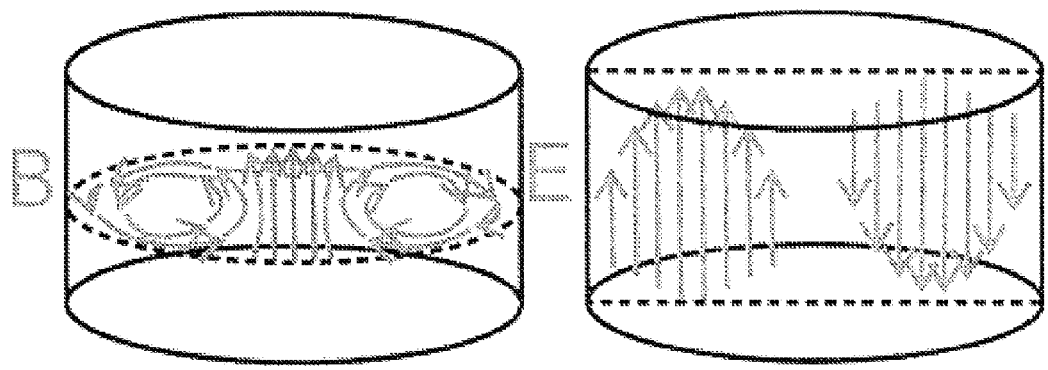

FIG. 1C schematically illustrates the field geometry of one of the $TM_{110}$ modes in the subject of FIGS. 1A and 1B, as follows:

Left drawing: The magnetic field (B) lies purely in a plane parallel to the xy-plane. Close to the z-axis, it is oriented substantially along the y-axis (front-to-back in FIG. 1C). Distal from the z-axis, it demonstrates a whirlpool form.

Right drawing: The electric field (E) is zero in the x- and y-directions, and also zero along the z-axis. To either side of the z-axis, it demonstrates a clear dipole form, with field lines oriented up/down parallel to the z-axis.

The other (simultaneously excited) $TM_{110}$ mode in the cavity 201 will be basically the same, but will be laterally rotated (in the xy-plane) through an angle of 90°, so that the magnetic field (B) lines close to the z-axis point left-right instead of front-back. In practice, the $TM_{110}$ B-field excited in the cavity will not be confined to a single plane: the situation illustrated on the left of FIG. 1C will exist in any plane taken normal to the z-axis (within the cavity).

Figure 1D:
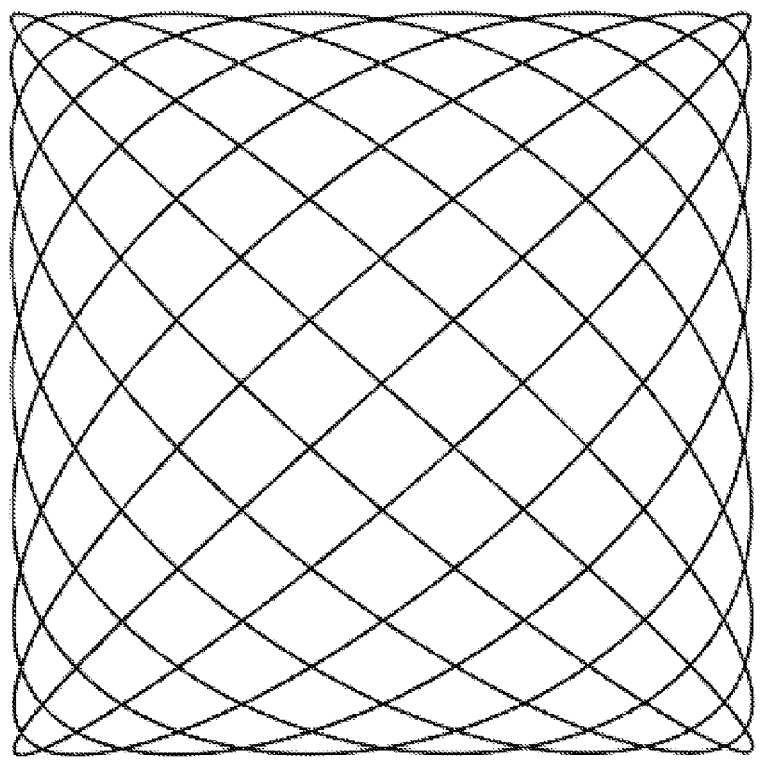

The effect of the abovementioned simultaneous resonances will be to superimpose an oscillatory x-deflection and an oscillatory y-deflection on a charged-particle beam propagating along the particle-optical axis 219. The resultant oscillation will cause said beam to trace out a composite geometrical figure (a Lissajous figure) on a (non-depicted) plane located downstream of the cavity 201 (beneath the aperture 221b in FIG. 1B). An example of such a geometrical figure is illustrated in FIG. 1D. If a (non-depicted) masking plate containing a small opening (such as a hole or slit) is located in said downstream plane, and the plate's opening is positioned so as to be intercepted by the geometrical figure, then, as the beam traverses the opening, it will produce a charged-particle pulse downstream of the masking plate.

In a specific configuration using the frequency values quoted above, the inventors observed a 150 MHz repetition rate for the figure depicted in FIG. 1D. When viewed along a given lateral direction, each such repetition will involve an outward and a homeward motion of the beam; if only one of these is selected, a 75MHz pulse frequency will be obtained. Using a masking plate having an opening (hole) width of ca. 10 μm and placed ca. 10 cm downstream of the exit aperture 221b, one can create electron pulses with a pulse length (duration) of ca. 100 fs for the abovementioned magnetic field value of B≈3 mT.

Embodiment 2

Figure 2:
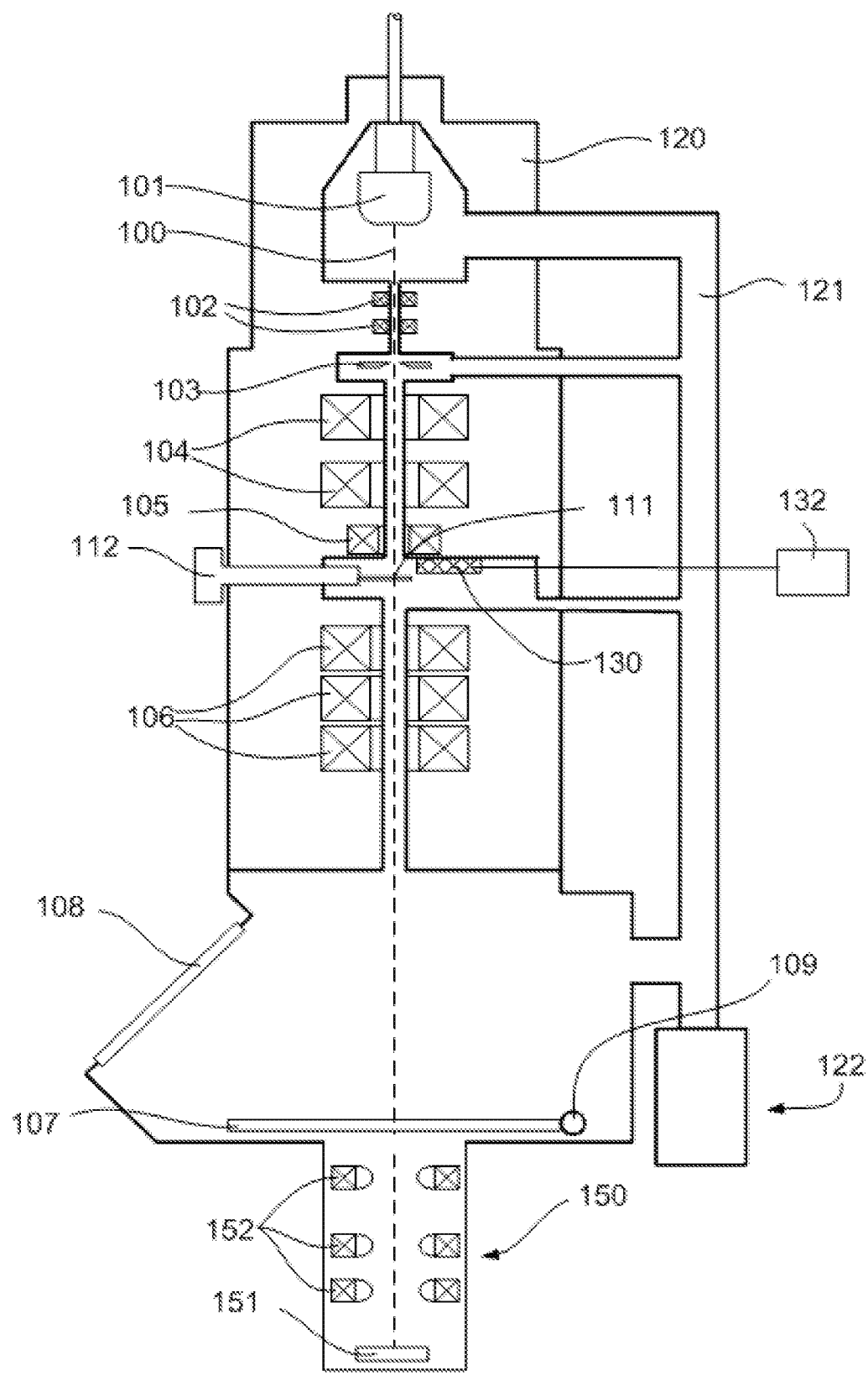
FIG. 2 shows a longitudinal cross-sectional view of a particular type of CPM (in this case, a TEM) in which the present invention can be implemented.

FIG. 2 renders a highly schematic longitudinal cross-sectional view of a particular embodiment of a CPM in which the current invention can be applied. In the present instance, the CPM is a TEM.

The depicted TEM comprises a vacuum housing 120 that is evacuated via tube 121 connected to a vacuum pump 122. A charged-particle source in the form of an electron gun 101 produces a beam of electrons along a particle-optical axis (imaging axis) 100. The electron source 101 can, for example, be a field emitter gun, a Schottky emitter, or a thermionic electron emitter. The electrons produced by the source 101 are accelerated to an adjustable energy of typically 80-300 keV (although TEMs using electrons with an adjustable energy of 50-500 keV, for example, are also known). The accelerated electron beam then passes through a beam limiting aperture/diaphragm 103 provided in a platinum sheet. To align the electron beam properly to the aperture 103, the beam can be shifted and tilted with the aid of deflectors 102, so that the central part of the beam passes through the aperture 103 along axis 100. Focusing of the beam is achieved using magnetic lenses 104 of a condenser system, together with (part of the) final condenser lens 105. Deflectors (not depicted) are used to center the beam on a region of interest on a sample, and/or to scan the beam over the surface of the sample. In this schematic, functional depiction, the deflectors 102 are shown relatively high up in the CPM, and final condenser lens 105 is shown as being relatively small; however, the skilled artisan will appreciate that deflectors 102 may be much lower in the CPM (e.g. nested within the lens 105), and that item 105 may be much larger than depicted.

The sample to be examined is held by a sample holder 112 in such a manner that it can be positioned in the object plane 111 of projection system 106 (whose uppermost lens element is conventionally referred to as an objective lens). The sample holder 112 may offer various positional/motional degrees of freedom (one or more of translation(s), pitch, roll and yaw), and may also have temperature control functionality (heating or cryogenic). It may be a conventional type of sample holder for holding a static sample in a containment plane; alternatively, the sample holder 112 can be of a special type that accommodates a moving sample in a flow plane/channel that can contain a stream of liquid water or other solution, for example.

The sample is imaged by projection system (projection lens system, projection column) 106 onto fluorescent screen 107, and can be viewed through a window 108. The enlarged image formed on the screen typically has a magnification in the range $10^3$x-$10^6$x, and may show details as small as 0.1 nm or less, for example. The fluorescent screen 107 is connected to a hinge 109, and can be retracted/folded away such that the image formed by the projection system 106 impinges upon image detector 151. It is noted that, in such an instance, the projection system 106 may need to be (slightly) re-focused so as to form the image on the image detector 151 instead of on the fluorescent screen 107. It is further noted that the projection system 106 may additionally form intermediate images at intermediate image planes (not depicted).

The image detector 151 may, for example, comprise a Charge-Coupled Device (CCD) or a Complementary Metal Oxide Semiconductor (CMOS) device, both of which can be used to detect impinging electrons. As an alternative to electron detection, one can also use a CCD/CMOS that detects light—such as the light emitted by a Yttrium Aluminium Garnet (YAG) crystal (for example) that is bonded to the CCD/CMOS, or connected thereto by optical fibers (for example). In such an indirect detector, the YAG crystal emits a number of photons when an electron hits the crystal, and a portion of these photons is detected by the CCD/CMOS; in direct detectors, electrons impinge on the semiconductor chip of the CCD/CMOS and generate electron/hole pairs, thereby forming the charge to be detected by the CCD/CMOS. The detector 151 is connected to a processing apparatus (controller) and display unit [not depicted].

The image formed on the fluorescent screen 107 and on the image detector 151 is generally aberrated due (for example) to imperfections produced in the projection system 106. To correct such aberrations, various multipoles can be deployed in/near the projection system 106. Such multipoles are not depicted in FIG. 2, so as to avoid cluttering the drawing, but the skilled artisan will be familiar with their design, positioning and implementation.

Where the imaging beam impinges on the sample 111, "stimulated radiation" is generated in the form of secondary electrons, visible (fluorescence) light, X-rays, etc. Detection and analysis of this radiation can provide useful information about the sample 111. To achieve such detection, FIG. 2 shows a supplementary detector 130, which is connected to a voltage source 132. As here depicted, the detector 130 is positioned at the side of the sample plane 111 proximal the gun 101; however, this is a matter of design choice, and a detector 130 may alternatively be positioned at the side of the sample plane 111 distal the gun 101, for example. The "detector" alluded to in the appended claims may be either or both of detectors 151 or 130, or another (undepicted) detector.

In addition to the detectors 151/130, the depicted apparatus may also be equipped with EELS or EFTEM functionality, for example. In this context:

For EELS: Deflectors 152 can be used to deflect transmitted electrons (traversing the sample) in a direction away from the optical axis 100 and toward an off-axis EELS detector, which is not shown in FIG. 2.

For EFTEM: Use can be made of an energy "filter", whose purpose is to select which energy range of electrons will be admitted to the detector 151 at any given time. Such filter functionality can be fulfilled by the deflection coils 152, which will "pass" certain electron energies while deflecting others aside.

It should be noted that FIG. 2 only shows a schematic rendition of a (simplified) TEM, and that, in reality, a TEM will generally comprise many more deflectors, apertures, etc.

In the context of the present invention, it is desirable to be able to pulse/chop the electron beam before it impinges on the sample being investigated. To this end, a (non-depicted) beam pulsing device according to the present invention is disposed about the particle-optical axis 100 at some point between the source 101 and the sample holder 112, preferably at a crossover point, e.g. a focal point of the penultimate condenser lens 104. This pulsing device will comprise a unitary resonant cavity as set forth above, e.g. similar to that in FIGS. 1A/1B and Embodiment 1.

Embodiment 3

FIG. 3 renders a schematic longitudinal cross-sectional view of another embodiment of a CPM in which the current invention can be applied. In the present instance, the CPM is a SEM.

In FIG. 3, a SEM 400 is equipped with an electron source 412 and a SEM column (particle-optical column) 402. This SEM column 402 uses electromagnetic lenses 414, 416 to focus electrons onto a sample 410, and also employs a deflection unit 418, ultimately producing an electron beam (imaging beam) 404. The SEM column 402 is mounted onto a vacuum chamber 406 that comprises a sample stage 408 for holding a sample 410 and that is evacuated with the aid of vacuum pumps (not depicted). The sample stage 408, or at least the sample 410, may be set to an electrical potential with respect to ground, using voltage source 422.

The apparatus is further equipped with a detector 420, for detecting secondary electrons that emanate from the sample 410 as a result of its irradiation by the imaging beam 404. In addition to the detector 420, this particular set-up (optionally) comprises a detector 430, which here takes the form of a plate provided with a central aperture 432 through which imaging beam 404 can pass. The apparatus further comprises a controller 424 for controlling inter alia the deflection unit 418, the lenses 414, 416, the detectors 420 and 430, and displaying obtained information on a display unit 426.

As a result of scanning the imaging beam 404 over the sample 410, output radiation, such as secondary electrons and backscattered electrons, emanates from the sample 410. In the depicted set-up, secondary electrons are captured and registered by the detector 420, whereas backscattered electrons are detected by detector 430. As the emanated output radiation is position-sensitive (due to said scanning motion), the obtained (detected/sensed) information is also position-dependent. The signals from the detectors 420 and 430, either severally or jointly, are processed by the controller 424 and displayed. Such processing may include combining, integrating, subtracting, false coloring, edge enhancing, and other processing known to the skilled artisan. In addition, automated recognition processes, such as used in particle analysis, for example, may be included in such processing.

In an alternative arrangement, voltage source 422 may be used to apply an electrical potential to the sample 410 with respect to the particle-optical column 402, whence secondary electrons will be accelerated towards the detector 430 with sufficient energy to be detected by it; in such a scenario, detector 420 can be made redundant. Alternatively, by substituting one or more of the detectors 420 for the detector 430, these detectors 420 can assume the role of detecting backscattered electrons, in which case the use of a dedicated detector 430 can be obviated. In light of such variants, the "detector" alluded to in the appended claims may be either or both of detectors 420 or 430, or another (undepicted) detector.

If desired, one can realize a controlled environment (other than vacuum) at the sample 410. For example, one can create a pressure of several mbar, as used in a so-called Environmental SEM (ESEM), and/or one can deliberately admit gases—such as etching or precursor gasses—to the vicinity of the sample 410. It should be noted that similar considerations apply to the case of a TEM, e.g. as set forth in Embodiment 2 above, whereby a so-called ETEM (Environmental TEM) can be realized, if desired.

Once again, in the context of the present invention, it is desirable to be able to pulse/chop the electron beam 404 before it impinges on the sample 410 being investigated. To this end, a (non-depicted) beam pulsing device according to the present invention is disposed about the particle-optical axis of the SEM 400 at some point between the source 412 and the sample holder 408, preferably at a crossover point, e.g. a focal point of the lens 414. This pulsing device will comprise a unitary resonant cavity as set forth above, e.g. similar to that in FIGS. 1A/1B and Embodiment 1.

Embodiment 4

FIG. 4 renders a schematic longitudinal cross-sectional view of yet another embodiment of a CPM in which the current invention can be applied. In the present instance, the CPM is a FIB microscope.

FIG. 4 shows a FIB tool 500, which comprises a vacuum chamber 502, an ion source 512 for producing a beam of ions along a particle-optical axis 514, and a FIB column (particle-optical column) 510. The FIB column includes electromagnetic (e.g. electrostatic) lenses 516a and 516b, and a deflector 518, and it serves to produce a focused ion beam (imaging beam) 508.

A workpiece (sample) 504 is placed on a workpiece holder (sample holder) 506. The workpiece holder 506 is embodied to be able to position the workpiece 504 with respect to the focused ion beam 508 produced by the FIB column 502.

The FIB apparatus 500 is further equipped with a Gas Injection System (GIS) 520. The GIS 520 comprises a capillary 522 though which a gas may be directed to the workpiece 504, and a reservoir 524 containing the gas (or a precursor substance used to produce the gas). A valve 526 can regulate the amount of gas directed to the workpiece 504. Such a gas may be used in depositing a (protective) layer on the workpiece 504, or to enhance a milling operation performed on the workpiece 504, for example. If desired, multiple GIS devices 520 may be employed, so as to supply multiple gases according to choice/requirement.

The FIB tool 500 is further equipped with a detector 530, which, as here embodied, is used to detect secondary radiation emanating from the sample 504 as a result of its irradiation by the ion beam 508. The signal from the detector 530 is fed to a controller 532. This controller 532 is equipped with a computer memory for storing the data derived from this signal. The controller 532 also controls other parts of the FIB, such as the lenses 516a/b, the deflector 518, the workpiece holder 506, the flow of the GIS 520 and the vacuum pumps (not depicted) serving to evacuate the chamber 502. In any case, the controller 532 is embodied to accurately position the ion beam 508 on the workpiece 504; if desired, the controller 532 may form an image/spectrum of detected/processed data on monitor 524.

Again, in the context of the present invention, it is desirable to be able to pulse/chop the ion beam before it impinges on the sample 504 being investigated. To this end, a (non-depicted) beam pulsing device according to the present invention is disposed about the particle-optical axis 514 at some point between the source 512 and the sample holder 506, preferably at a crossover point, e.g. a focal point of the lens 516a. This pulsing device will comprise a unitary resonant cavity as set forth above, e.g. similar to that in FIGS. 1A/1B and Embodiment 1.

The invention claimed is:

1. A charged-particle microscope comprising:
    a charged-particle source, for producing a beam of charged particles that propagates along a particle-optical axis;
    a sample holder, for holding and positioning a sample;
    a charged-particle lens system, for directing said beam onto the sample held by the sample holder;
    a detector, for detecting radiation emanating from the sample as a result of its interaction with the beam;
    a beam pulsing device, for causing the beam to repeatedly switch on and off so as to produce a pulsed beam; and
    an oscillating power supply connected to the beam pulsing device,
    wherein the beam pulsing device comprises a unitary resonant cavity disposed about said particle-optical axis and having an entrance aperture and an exit aperture for the beam, the unitary resonant cavity being configured to independently adjust a pulse length and a pulse frequency of the pulsed beam by:
        simultaneously producing a first oscillatory deflection of the beam at a first frequency in a first direction and a second oscillatory deflection of the beam at a second, different frequency in a second, different direction,
        altering a frequency difference between the first frequency and the second frequency to adjust the pulse frequency; and
        adjusting an amplitude of an output of the oscillating power supply to the unitary resonant cavity to adjust the pulse length.

2. The charged-particle microscope according to claim 1, wherein said unitary resonant cavity:
    is substantially cylindrical in form, with a cylindrical axis that is substantially collinear with said particle-optical axis; and
    is configured to be excited in $TM_{110}$ resonant mode.

3. The charged-particle microscope according to claim 1, wherein, when viewed in a direction normal to said particle-optical axis, the unitary resonant cavity has an elongated cross-section, with a long axis parallel to said first direction and a short axis parallel to said second direction.

4. The charged-particle microscope according to claim 3, wherein said cross-section is substantially an ellipse whose major and a minor axis correspond respectively to said first and second directions.

5. The charged-particle microscope according to claim 3, wherein the unitary resonant cavity is mechanically deformable so as to adjust a ratio of the lengths of said long and short axes.

6. The charged-particle microscope according to claim 1, wherein said unitary resonant cavity comprises a dielectric material that is disposed about said particle-optical axis and that contains a substantially axially symmetric void through which the beam can pass.

7. The charged-particle microscope according to claim 6, wherein an interface between said void and said dielectric material is at least partially coated by a film of electrically conductive material.

8. The charged-particle microscope according to claim 1, wherein:
    in operation, said unitary resonant cavity is configured to cause the beam to trace out a composite geometrical figure on a masking plane perpendicular to the particle-optical axis; and
    the microscope comprises a masking plate located in said masking plane and having an opening that can be positioned so as to intersect said composite geometrical figure, thus serving to admit a pulse of charged particles as the beam traces across said opening.

9. The charged-particle microscope according to claim 8, wherein said composite geometrical figure is a Lissajous figure.

10. The charged-particle microscope according to claim 1, additionally comprising apparatus for applying a stimulus to the sample, which stimulus can be synchronized to the output of the beam pulsing device.

11. A method of examining a sample using a charged-particle microscope, comprising:
    providing the sample on a sample holder;
    using a charged-particle source to produce a beam of charged particles that propagates along a particle-optical axis;
    using a beam pulsing device to repeatedly switch the beam, thus producing a pulsed beam;
    using a charged-particle lens system to direct the pulsed beam onto the sample;
    using a detector to detect radiation emanating from the sample as a result of its interaction with the beam,
    employing a unitary resonant cavity as part of the beam pulsing device, disposing this cavity about the particle-optical axis, and passing the beam through the cavity via entrance and exit apertures;

exciting the unitary resonant cavity to simultaneously produce a first oscillatory deflection of the beam at a first frequency in a first direction and a second oscillatory deflection of the beam at a second, different frequency in a second, different direction;

adjusting a pulse frequency of the pulsed beam by altering a frequency difference between the first frequency and the second frequency; and adjusting a pulse length of the pulsed beam by adjusting an amplitude of an output of an oscillating power supply connected to the unitary resonant cavity.

12. A beam pulsing device for use with a charged-particle microscope, the beam pulsing device causing a charged-particle beam to repeatedly switch on and off so as to produce a pulsed beam, the beam pulsing device comprising:

a unitary resonant cavity disposed about a particle-optical axis of the charged-particle microscope and having an entrance aperture and an exit aperture for the charged particle beam, the unitary resonant cavity being configured to independently adjust a pulse length and a pulse frequency of the pulsed beam by:

simultaneously producing a first oscillatory deflection of the beam at a first frequency in a first direction and a second oscillatory deflection of the beam at a second, different frequency in a second, different direction, altering a frequency difference between the first frequency and the second frequency to adjust the pulse frequency; and adjusting an amplitude of an output of an oscillating power supply connected to the unitary resonant cavity to adjust the pulse length.

13. The beam pulsing device of claim 12, wherein said unitary resonant cavity:

is substantially cylindrical in form, with a cylindrical axis that is substantially collinear with said particle-optical axis; and is configured to be excited in $TM_{110}$ resonant mode.

14. The beam pulsing device of claim 12, wherein, when viewed in a direction normal to said particle-optical axis, the unitary resonant cavity has an elongated cross-section, with a long axis parallel to said first direction and a short axis parallel to said second direction.

15. The beam pulsing device of claim 14, wherein said cross-section is substantially an ellipse whose major and minor axis correspond respectively to said first and second directions.

16. The beam pulsing device of claim 14, wherein the unitary resonant cavity is mechanically deformable so as to adjust a ratio of the lengths of said long and short axes.

17. The beam pulsing device of claim 12 wherein said unitary resonant cavity comprises a dielectric material that is disposed about said particle-optical axis and that contains a substantially axially symmetric void through which the beam can pass.

18. The beam pulsing device of claim 17, wherein an interface between said void and said dielectric material is at least partially coated by a film of electrically conductive material.

19. The beam pulsing device of claim 12, wherein:

in operation, said unitary resonant cavity is configured to cause the beam to trace out a composite geometrical figure on a masking plane perpendicular to the particle-optical axis; and the charged-particle microscope comprises a masking plate located in said masking plane and having an opening that can be positioned so as to intersect said composite geometrical figure, thus serving to admit a pulse of charged particles as the beam traces across said opening.

20. The beam pulsing device of claim 19, wherein said composite geometrical figure is a Lissajous figure.

* * * * *